United States Patent
Sun

(10) Patent No.: US 8,153,483 B2
(45) Date of Patent: Apr. 10, 2012

(54) SEMICONDUCTOR DEVICE HAVING A VERTICAL TRANSISTOR AND METHOD FOR MANUFACTURING THE SAME

(75) Inventor: Woo-Kyung Sun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 379 days.

(21) Appl. No.: 12/563,948

(22) Filed: Sep. 21, 2009

(65) Prior Publication Data
US 2010/0009505 A1 Jan. 14, 2010

Related U.S. Application Data

(62) Division of application No. 11/757,330, filed on Jun. 1, 2007, now Pat. No. 7,592,643.

(30) Foreign Application Priority Data

Oct. 31, 2006 (KR) .................... 10-2006-0106902

(51) Int. Cl.
*H01L 21/00* (2006.01)

(52) U.S. Cl. ........................................ 438/156; 257/135
(58) Field of Classification Search .................. 438/156, 438/157, 164, 268; 257/302, 332, 135, 328, 257/E21.693, E21.377, E29.183, E27.096
See application file for complete search history.

(56) References Cited

U.S. PATENT DOCUMENTS

| 6,072,209 A | 6/2000 | Noble et al. |
| 6,881,994 B2 * | 4/2005 | Lee et al. .................. 257/296 |
| 7,525,146 B2 * | 4/2009 | Song et al. .................. 257/314 |

* cited by examiner

*Primary Examiner* — David Vu
(74) *Attorney, Agent, or Firm* — Kilpatrick Townsend & Stockton LLP

(57) ABSTRACT

A semiconductor device having a vertical transistor comprises a silicon substrate; a drain region, a channel region and a source region vertically stacked on the silicon substrate; a buried type bit line formed under the drain region in the silicon substrate to contact with the drain region and to extend in one direction; and gates respectively formed on both side walls of the stacked drain region, channel region and source region.

13 Claims, 9 Drawing Sheets

SEMICONDUCTOR DEVICE HAVING A VERTICAL TRANSISTOR AND METHOD FOR MANUFACTURING THE SAME

CROSS-REFERENCE TO RELATED APPLICATION

The present application is a divisional of patent application Ser. No. 11/757,330 filed on Jun. 1, 2007 and claims priority to Korean patent application number 10-2006-0106902 filed on Oct. 31, 2006, which are incorporated herein by reference in their entirety.

BACKGROUND OF THE INVENTION

The present invention relates to a semiconductor device, and more particularly, to a semiconductor device having a vertical transistor which can eliminate a floating body effect and a method for manufacturing the same.

Recently, in the semiconductor industry, technologies have been developed to increase the degree of integration, the operational speed and the functionality of a semiconductor device. For example, in order to overcome limitations in the degree of integration and the current of a semiconductor device having an existing planar transistor, a semiconductor device having a vertical transistor has been developed.

Unlike the existing planar transistor in which source and drain regions are formed on opposite sides of a substrate so that a channel region is formed in a horizontal direction, the vertical transistor includes source and drain regions that are formed above and below a substrate so that a channel region is formed in a vertical direction. In the vertical transistor, due to the vertical channel region, high integration is possible. Since a channel length can be increased even with the high integration, the short channel effect can be suppressed.

However, in the conventional vertical transistor, it is difficult to form a DRAM cell structure by itself. Also, since the body of the transistor is floated from the substrate, the floating body effect is induced by reverse bias between a source region and the substrate. Therefore, in a semiconductor device having the conventional vertical transistor, it is difficult to adjust the characteristics of the semiconductor device.

BRIEF SUMMARY OF THE INVENTION

An embodiment of the present invention is directed to a semiconductor device having a vertical transistor which can eliminate a floating body effect, and a method for manufacturing the same.

In one embodiment, a semiconductor device having a vertical transistor comprises a silicon substrate. A drain region, a channel region and a source region are vertically stacked on the silicon substrate. A buried type bit line is formed under the drain region in the silicon substrate to contact the drain region and to extend in one direction. Gates are respectively formed on both side walls of the stacked drain region, channel region and source region.

The source region and the drain region are each made of a first conductivity type impurity ion implantation layer which is heavily doped. The channel region is made of a second conductivity type impurity ion implantation layer which is heavily doped. The buried type bit line is made of a first conductivity type impurity ion implantation layer which is more heavily doped than the source region and the drain region.

The drain region is positioned on a surface of the buried type bit line and the gates are formed over a partial thickness of the drain region.

The semiconductor device further comprises a well formed under the buried type bit line in the silicon substrate. The well comprises a second conductivity type impurity ion implantation layer which is lightly doped.

The semiconductor device further comprises an insulation layer formed on the silicon substrate which is formed with the gates to expose a surface of the source region.

In another embodiment, a method for manufacturing a semiconductor device having a vertical transistor comprises forming a first conductivity type first ion implantation layer, a second conductivity type second ion implantation layer, a first conductivity type third ion implantation layer and a first conductivity type fourth ion implantation layer in a silicon substrate such that the ion implantation layers are sequentially positioned from a surface toward the inside of the silicon substrate. The first through fourth ion implantation layers are etched to form stack patterns including buried type bit lines, each of which comprises the first conductivity type fourth ion implantation layer extending in one direction. A first insulation layer is formed on the silicon substrate to fill spaces between the stack patterns. The first conductivity type first ion implantation layer, the second conductivity type second ion implantation layer and a partial thickness of the first conductivity type third ion implantation layer of each stack pattern are etched to form a drain region, a channel region and a source region which are vertically stacked. Gates are formed on both side walls of the drain region, the channel region and the source region, which are vertically stacked. A second insulation layer is formed on the silicon substrate which is formed with the gates to expose the source region.

The first conductivity type first and third ion implantation layers are formed by heavily ion-implanting n-type impurities. The second conductivity type second ion implantation layer is formed by heavily ion-implanting p-type impurities. The first conductivity type fourth ion implantation layer is formed by more heavily ion-implanting n-type impurities than the first conductivity type first and third ion implantation layers.

The first conductivity type first ion implantation layer is formed by ion-implanting n-type impurities at a concentration of $1\times10^{12}$-$1\times10^{15}$ ions/cm$^2$ and an energy level of 10-50 KeV.

The second conductivity type second ion implantation layer is formed by ion-implanting p-type impurities at a concentration of $1\times10^{12}$-$1\times10^{15}$ ions/cm$^2$ and an energy level of 10-150 KeV.

The first conductivity type third ion implantation layer is formed by ion-implanting n-type impurities at a concentration of $1\times10^{12}$-$1\times10^{15}$ ions/cm$^2$ and an energy level of 100-150 KeV.

The first conductivity type fourth ion implantation layer is formed by ion-implanting n-type impurities at a concentration of $1\times10^{16}$-$1\times10^{20}$ ions/cm$^2$ and an energy level of 150-300 KeV.

The first through fourth ion implantation layers are formed by ion-implanting the n-type and p-type impurities in a state in which a buffer insulation layer is formed on the silicon substrate.

After ion-implanting the n-type and p-type impurities to form the first through fourth ion implantation layers, the method further comprises conducting rapid thermal annealing to prevent the concentrations of the impurities from being changed.

Forming a first insulation layer to fill spaces between the stack patterns comprises forming a first insulation layer on the silicon substrate to cover the stack patterns, and chemically and mechanically polishing the first insulation layer to expose the stack patterns.

Forming gates comprises ion-implanting oxygen into the silicon substrate which is formed with the vertically stacked drain region, channel region and source region; thermally oxidizing the silicon substrate which is implanted with oxygen ions to form a gate insulation layer on surfaces of the vertically stacked drain region, channel region and source region such that a thickness of a portion of the gate insulation layer which is implanted with oxygen ions is greater than a thickness of a portion of the gate insulation layer which is not implanted with oxygen ions; forming a gate conductive layer on the gate insulation layer; and anisotropically etching the gate conductive layer and the gate insulation layer.

Anisotropically etching the gate conductive layer and the gate insulation layer is conducted by over-etching such that a partial thickness of the drain region is also etched.

The method further comprises forming a second conductivity type fifth ion implantation layer under the first conductivity type fourth ion implantation layer. The second conductivity type fifth ion implantation layer is formed by ion-implanting p-type impurities at a concentration of $1 \times 10^{11}$-$1 \times 10^{13}$ ions/cm$^2$ and an energy level of 300-1,000 KeV.

DESCRIPTION OF SPECIFIC EMBODIMENT

In the present invention, a bit line is formed as a buried type, and a vertical transistor is formed on the buried type bit line. Gates are respectively formed on both side walls of a drain region, a channel region and a source region which are sequentially stacked in a vertical direction.

Since the bit line is a buried type formed in a silicon substrate, the degree of integration of a semiconductor device can be increased. Also, because the gates are respectively formed on both side walls of the stacked drain region, channel region and source region, current can be increased, and it the floating body effect may be adjusted.

Figure 1F:
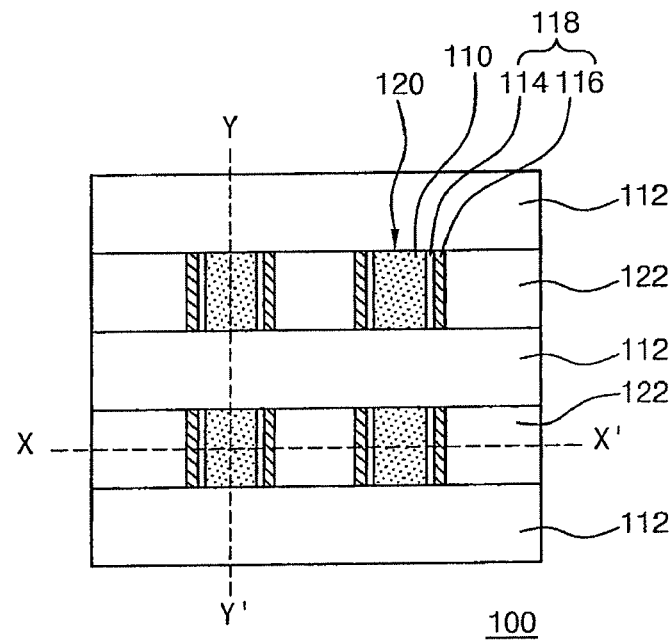

A semiconductor device having a vertical transistor in accordance with an embodiment of the present invention will be described with reference to FIGS. 1F, 2F and 3F. FIG. 1F is a plan view, FIG. 2F is a cross-sectional view taken along the line X-X' of FIG. 1F, and FIG. 3F is a cross-sectional view taken along the line Y-Y' of FIG. 1F.

The semiconductor device according to the present invention has a vertical transistor 120 which is structured such that a drain region 106, a channel region 108 and a source region 110 are vertically stacked. Gates 118 are respectively formed on both side walls of the vertically stacked drain region 106, channel region 108 and source region 110. The semiconductor device according to the present invention includes a bit line 104 which is formed as a buried type to extend in one direction under the drain region 106. Insulation layers 112 and 122 are formed between the gates 118 to expose the surface of the source region 110. The semiconductor device according to the present invention also includes a well 102 which is formed in a silicon substrate 100 under the buried type bit line 104.

The source region 110 and the drain region 106 are each made of a first conductivity type impurity ion implantation layer which is heavily doped. The channel region 108 is made of a second conductivity type impurity ion implantation layer which is heavily doped. The buried type bit line 104 is made of a first conductivity type impurity ion implantation layer which is more heavily doped than the source region 110 and the drain region 106. The well 102 is made of a second conductivity type impurity ion implantation layer which is lightly doped.

The drain region 106 has a structure which is formed such that the drain region 106 is placed on the overall surface of the buried type bit line 104. The gates 118 are each composed of a gate insulation layer 114 and a gate conductive layer 116. The gates 118 are formed on the surfaces of the drain region 106 through a partial thickness of the drain region 106.

Due to the gates 118 being respectively formed on both side walls of the vertically stacked drain region 106, channel region 108 and source region 110, the semiconductor device according to the present invention has two gates 118. Accordingly, the degree of integration and current can be increased. In particular, even though the channel region 108 is floated from the body of the transistor 120, the floating body effect can be eliminated.

Hereafter, a method for manufacturing the semiconductor device having a vertical transistor in accordance with an embodiment of the present invention will be described with reference to FIGS. 1A through 1F, FIGS. 2A through 2F, and FIGS. 3A through 3F. FIGS. 1A through 1F are plan views, FIGS. 2A through 2F are cross-sectional views taken along the line X-X' of FIGS. 1A through 1F, and FIGS. 3A through 3F are cross-sectional views taken along the line Y-Y' of FIGS. 1A through 1F.

Figure 1A:
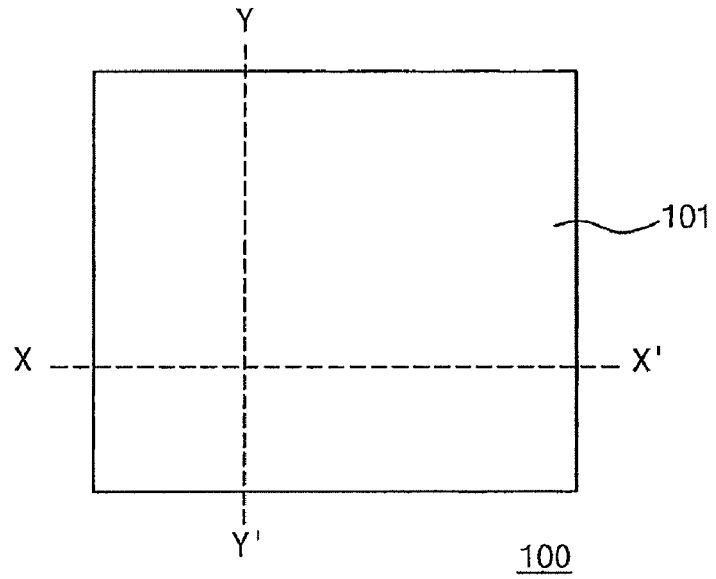
FIGS. 1A through 1F are plan views illustrating processes of a method for manufacturing a semiconductor device having a vertical transistor in accordance with an embodiment of the present invention.
Figure 2A:
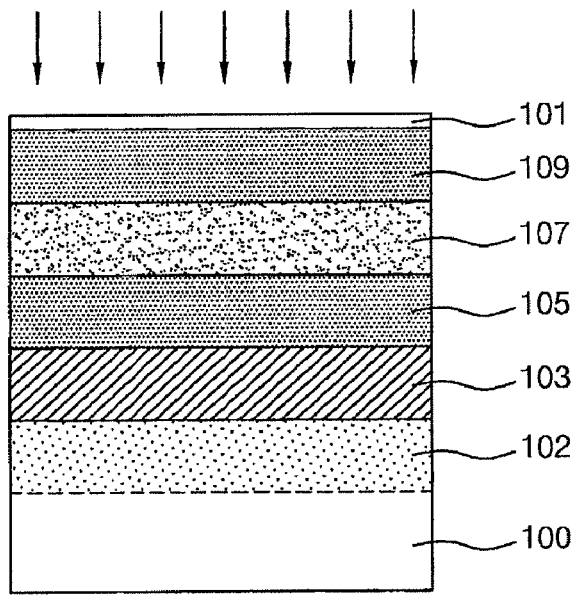
FIGS. 2A through 2F are cross-sectional views taken along the line X-X' of FIGS. 1A through 1F.
Figure 3A:
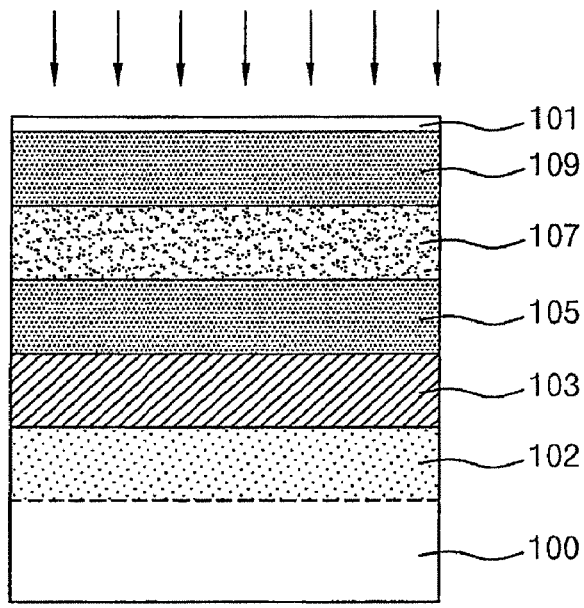
FIGS. 3A through 3F are cross-sectional views taken along the line Y-Y' of FIGS. 1A through 1F.

Referring to FIGS. 1A, 2A and 3A, a buffer insulation layer 101, which is made of an oxide layer or a nitride layer, is formed on a silicon substrate 100. P-type and n-type impurities are ion-implanted into the silicon substrate 100 which is formed with the buffer oxide layer 101. An n-type first impurity ion implantation layer 109, which is heavily doped, a p-type first impurity ion implantation layer 107, which is heavily doped, an n-type second impurity ion implantation layer 105, which is heavily doped, an n-type third impurity ion implantation layer 103, which is more heavily doped than the n-type second impurity ion implantation layer 105, and a p-type second impurity ion implantation layer 103, which is lightly doped, are formed such that they are sequentially positioned from the surface toward the inside of the silicon substrate 100. Example p-type impurities that are used include B, BF$_2$ and In, and example n-type impurities that are used include P, As and Sb.

The heavily-doped n-type first impurity ion implantation layer 109 constitutes a source region, and is formed by ion-implanting n-type impurities at a concentration of $1 \times 10^{12}$-$1 \times 10^{15}$ ions/cm$^2$ and an energy level of 10-50 KeV. The heavily-doped p-type first impurity ion implantation layer 107 constitutes a channel region, and is formed by ion-implanting p-type impurities at a concentration of $1 \times 10^{12}$-$1 \times 10^{15}$ ions/cm$^2$ and an energy level of 10-150 KeV. The heavily-doped n-type second impurity ion implantation layer 105 constitutes a drain region, and is formed by ion-implanting n-type impurities at a concentration of $1 \times 10^{12}$-$1 \times 10^{15}$ ions/cm$^2$ and an energy level of 100-150 KeV. The heavily-doped n-type third impurity ion implantation layer 103 constitutes a bit line, and is formed by ion-implanting n-type impurities at a concentration of $1\times10^{16}$-$1\times10^{20}$ ions/cm² and an energy level of 150-300 KeV. The lightly-doped p-type second impurity ion implantation layer 102 constitutes a well, and is formed by ion-implanting p-type impurities at a concentration of $1\times10^{11}$-$1\times10^{13}$ ions/cm² and an energy level of 300-1,000 KeV.

In order to prevent a change in the concentrations of the impurities of the respective ion implantation layers 102, 103, 105, 107 and 109 which are formed through ion-implantation of the n-type and p-type impurities, rapid thermal annealing (RTA) is conducted for the silicon substrate 100.

Figure 1B:
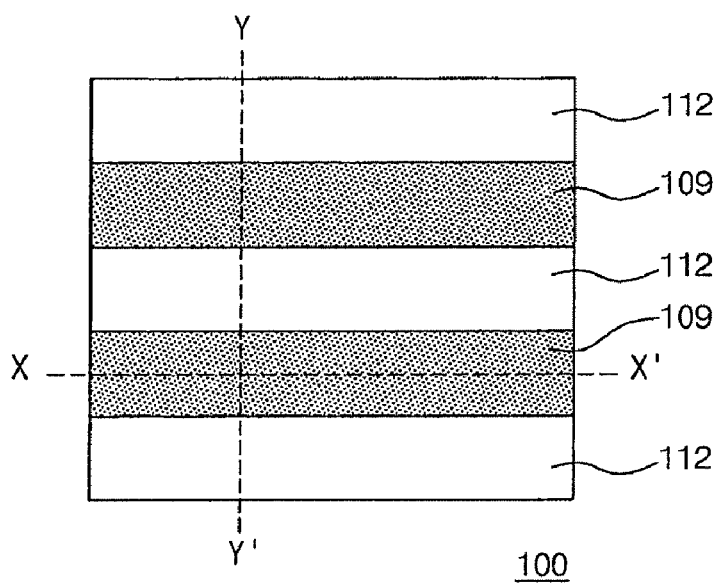
Figure 2B:
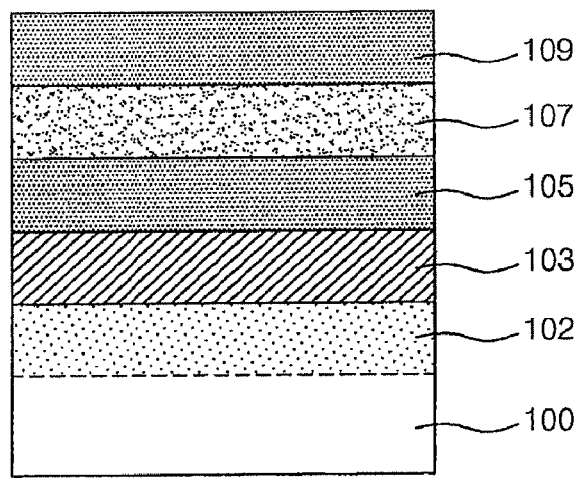
Figure 3B:
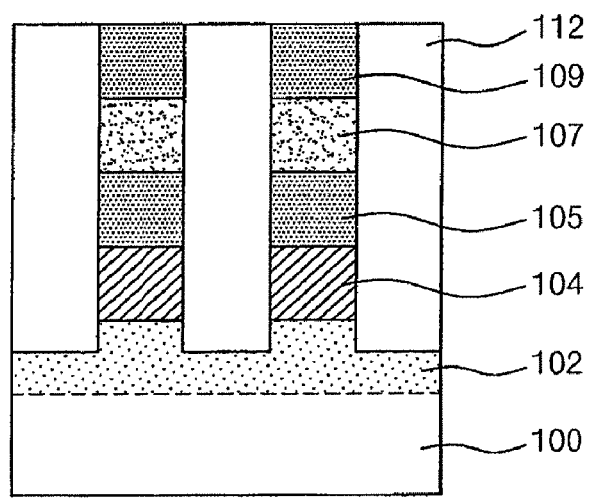

Referring to FIGS. 1B, 2B and 3B, the buffer insulation layer 101 is removed. Using a well-known photolithography process, the heavily-doped n-type first impurity ion implantation layer 109, the heavily-doped p-type first impurity ion implantation layer 107 and the heavily-doped n-type second impurity ion implantation layer 105 are etched. Then, the heavily-doped n-type third impurity ion implantation layer 103 is etched, thereby forming a bit line 104 extending in one direction. The etching to form the bit line 104 is implemented as over-etching. The lightly-doped p-type second impurity ion implantation layer 102, which is partially etched due to the over-etching, serves a well by itself. In the following description, the reference numeral 102 designates a well.

In order to separate adjacent cells and bit lines 104, a first insulation layer 112 is deposited on the silicon substrate 100 which is formed with stack patterns including bit lines 104. The first insulation layer 112 is CMPed (chemically and mechanically polished) such that the heavily-doped n-type first impurity ion implantation layer 109 is exposed.

Figure 1C:
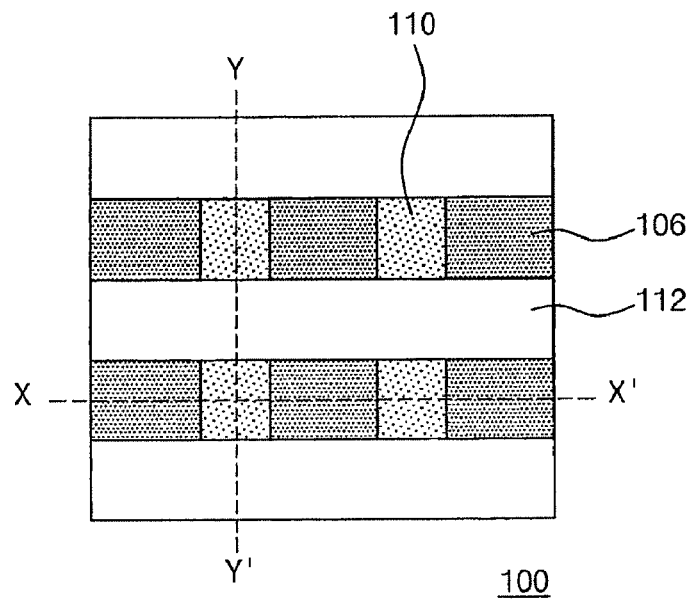
Figure 2C:
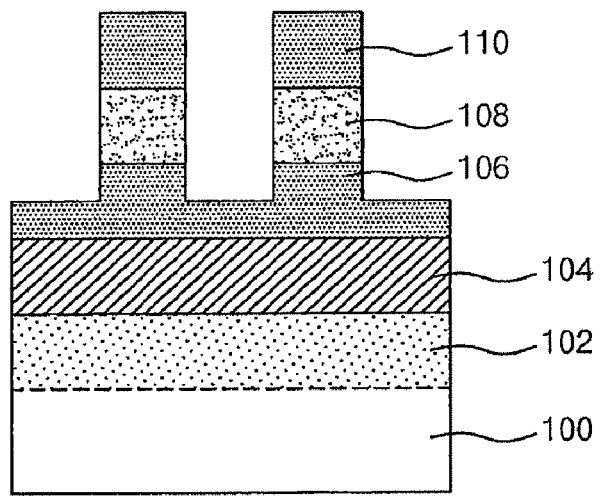
Figure 3C:
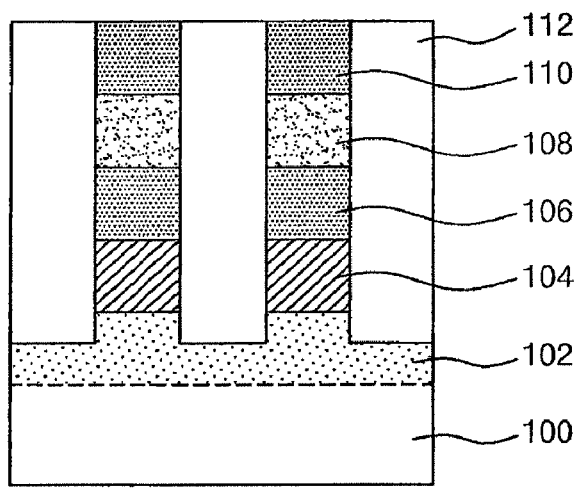

Referring to FIGS. 1C, 2C and 3C, by sequentially etching using a well-known photolithography process, the heavily-doped n-type first impurity ion implantation layer 109, the heavily-doped p-type first impurity ion implantation layer 107 and a partial thickness of the heavily-doped n-type second impurity ion implantation layer 105 in a direction which is perpendicular to the bit line 104, a drain region 106, a channel region 108 and a source region 110 are formed to be vertically stacked on the bit line 104. Oxygen ions are implanted into the silicon substrate 100 which is formed with the vertically stacked drain region 106, channel region 108 and source region 110. The oxygen ion implantation is conducted to ensure that, when subsequently forming a gate insulation layer through thermal oxidation, one portion of the gate insulation layer, which is implanted with oxygen ions, and the other portion of the gate insulation layer, which is not implanted with oxygen ions, are oxidized to different degrees and therefore have different thicknesses.

Figure 1D:
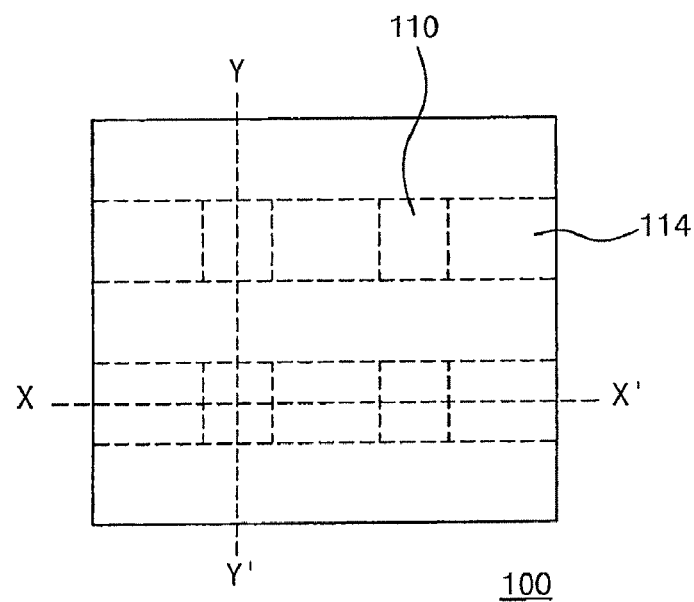
Figure 2D:
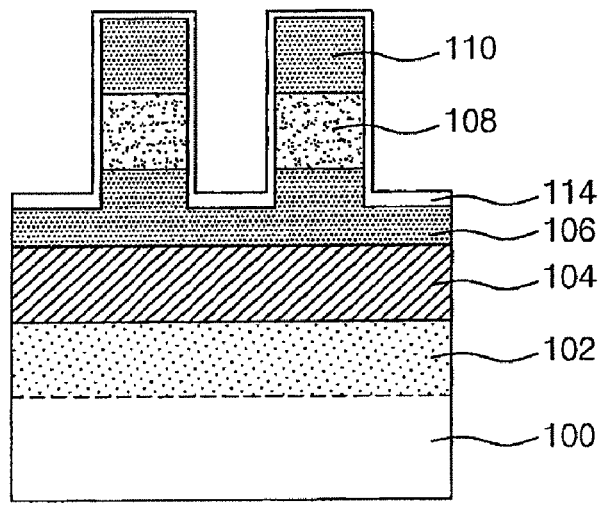
Figure 3D:
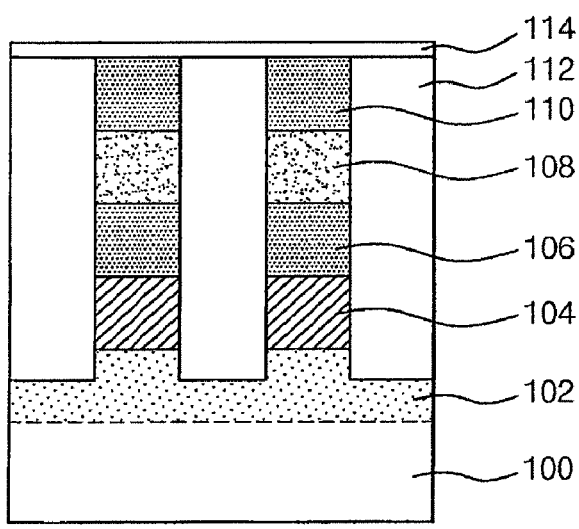

Referring to FIGS. 1D, 2D and 3D, a thermal oxidation process is implemented for the silicon substrate 100 which is implanted with oxygen ions. A gate insulation layer 114 is formed on the surfaces of the stacked drain region 106, channel region 108 and source region 110 and the surface of the silicon substrate 100 including the first insulation layer 112. Due to the selective implantation of oxygen ions in the gate insulation layer 114, one portion of the gate insulation layer 114, which is implanted with oxygen ions, is thicker than the other portion of the gate insulation layer 114, which is not implanted with oxygen ions. Accordingly, in the semiconductor device according to the present invention, the bit line 104 and a subsequently formed vertical transistor can be effectively insulated from each other.

Figure 1E:
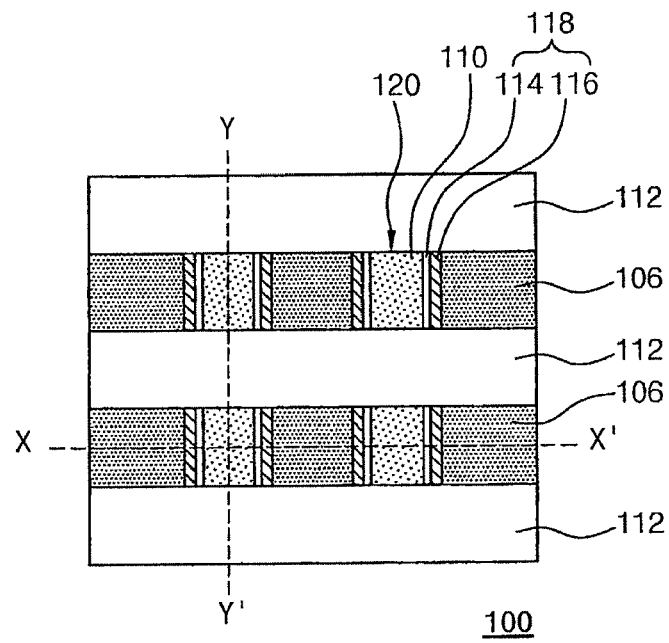
Figure 2E:
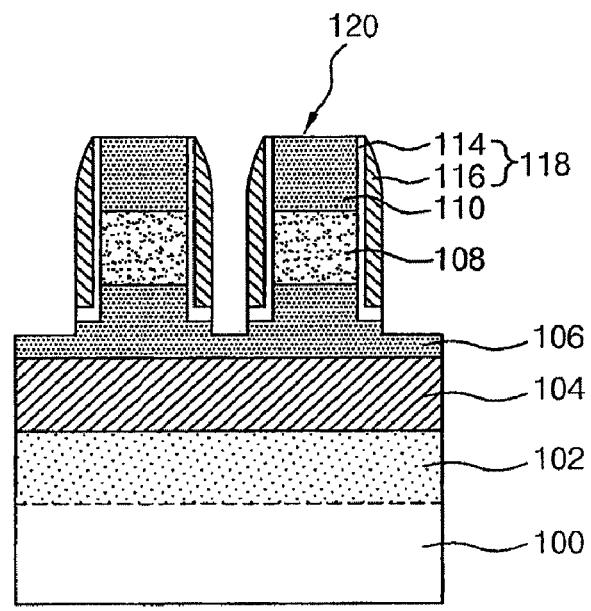
Figure 2F:
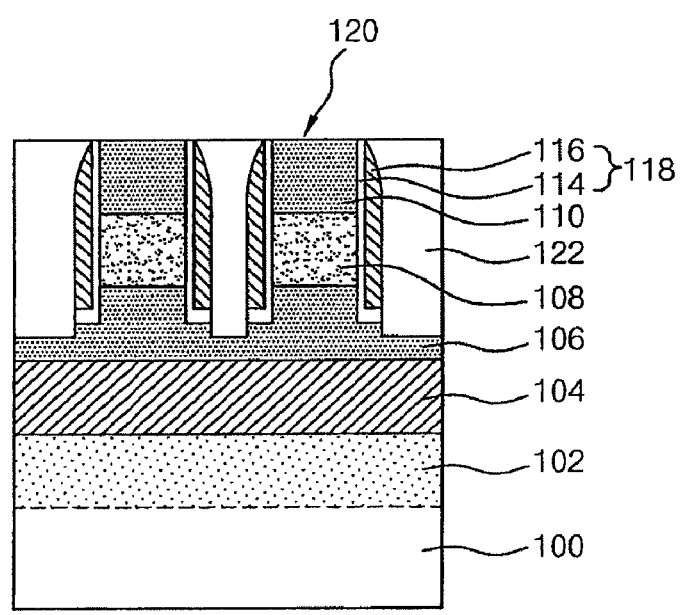
Figure 3E:
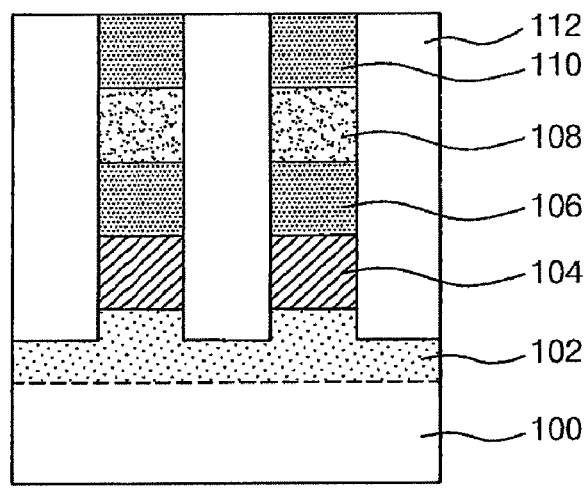
Figure 3F:
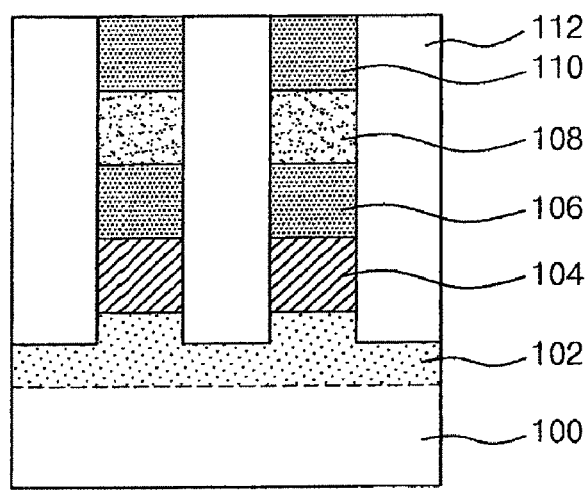

Referring to FIGS. 1E, 2E and 3E, a gate conductive layer 116 is formed on the gate insulation layer 114. The gate conductive layer 116 is made of a polysilicon layer or a stack of a polysilicon layer and a metal-based layer. By anisotropically etching the gate conductive layer 116 and the gate insulation layer 114, gates 118 are formed on both side walls of the vertically stacked drain region 106, channel region 108 and source region 110. As a result, a vertical transistor 120 is formed with a channel in a direction perpendicular to the silicon substrate 100. The anisotropic etching of the gate conductive layer 116 and the gate insulation layer 114 is implemented as over-etching such that a partial thickness of the drain region 106 is also etched.

In the vertical transistor 120 according to the present invention, since the gates 118 are respectively formed on both side walls of the vertically stacked drain region 106, channel region 108 and source region 110, current can be increased and the floating body effect can be efficiently eliminated.

Referring to FIGS. 1F, 2F and 3F, a second insulation layer 122 is deposited on the silicon substrate 100 which is formed with the vertical transistor 120. The second insulation layer 122 is then chemically and mechanically polished such that the source region 110 is exposed.

Thereafter, while not shown in the drawings, by forming a capacitor which is brought into contact with the exposed source region 110 and by sequentially conducting a series of subsequent known processes, the manufacture of the semiconductor device having a vertical transistor according to the present invention is completed.

As is apparent from the above description, in the present invention, since a vertical transistor is formed with a channel in a direction which is perpendicular to a substrate, the degree of integration can be increased. Also, in the present invention, because a bit line is formed in the silicon substrate as a buried type, while a vertical transistor structure is adopted, a DRAM cell structure can be easily realized and the degree of integration can be further increased. Moreover, in the present invention, due to the vertical transistor having two gates, current can be improved, and even though a channel region is floated from the body of the transistor, the floating body effect can be eliminated.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device having a vertical transistor, the method comprising:
   forming a first conductivity type first ion implantation layer, a second conductivity type second ion implantation layer, a first conductivity type third ion implantation layer and a first conductivity type fourth ion implantation layer in a silicon substrate such that the ion implantation layers are sequentially positioned from a surface toward the inside of the silicon substrate;
   etching the first through fourth ion implantation layers to form stack patterns including buried type bit lines, each of which comprises the first conductivity type fourth ion implantation layer extending in one direction;
   forming a first insulation layer on the silicon substrate to fill spaces between the stack patterns;
   etching the first conductivity type first ion implantation layer, the second conductivity type second ion implantation layer and a partial thickness of the first conductivity type third ion implantation layer of each stack pattern to form a drain region, a channel region and a source region which are vertically stacked;

forming gates on both side walls of the drain region, the channel region and the source region, wherein the drain region, the channel region and the source region are vertically stacked; and forming a second insulation layer on the silicon substrate which is formed with the gates, to expose the source region.

2. The method according to claim 1, wherein the first conductivity type first and third ion implantation layers are formed by heavily ion-implanting n-type impurities, the second conductivity type second ion implantation layer is formed by heavily ion-implanting p-type impurities, and the first conductivity type fourth ion implantation layer is formed by more heavily ion-implanting n-type impurities than the first conductivity type first and third ion implantation layers.

3. The method according to claim 2, wherein the first conductivity type first ion implantation layer is formed by ion-implanting n-type impurities at a concentration of approximately $1\times10^{12}$-$1\times10^{15}$ ions/cm$^2$ and an energy level of approximately 10-50 KeV.

4. The method according to claim 2, wherein the second conductivity type second ion implantation layer is formed by ion-implanting p-type impurities at a concentration of approximately $1\times10^{12}$-$1\times10^{15}$ ions/cm$^2$ and an energy level of approximately 10-150 KeV.

5. The method according to claim 2, wherein the first conductivity type third ion implantation layer is formed by ion-implanting n-type impurities at a concentration of approximately $1\times10^{12}$-$1\times10^{15}$ ions/cm$^2$ and an energy level of approximately 100-150 KeV.

6. The method according to claim 2, wherein the first conductivity type fourth ion implantation layer is formed by ion-implanting n-type impurities at a concentration of approximately $1\times10^{16}$-$1\times10^{20}$ ions/cm$^2$ and an energy level of approximately 150-300 KeV.

7. The method according to claim 2, wherein the first through fourth ion implantation layers are formed by ion-implanting the n-type and p-type impurities in a state in which a buffer insulation layer is formed on the silicon substrate.

8. The method according to claim 2, wherein, after ion-implanting the n-type and p-type impurities to form the first through fourth ion implantation layers, the method further comprises:

conducting rapid thermal annealing to prevent the concentrations of the impurities from being changed.

9. The method according to claim 1, wherein forming a first insulation layer to fill spaces between the stack patterns comprises:

forming a first insulation layer on the silicon substrate to cover the stack patterns; and chemically and mechanically polishing the first insulation layer to expose the stack patterns.

10. The method according to claim 1, wherein forming gates comprises:

ion-implanting oxygen into the silicon substrate which is formed with the vertically stacked drain region, channel region and source region;

thermally oxidizing the silicon substrate which is implanted with oxygen ions to form a gate insulation layer on surfaces of the vertically stacked drain region, channel region and source region such that a thickness of a portion of the gate insulation layer which is implanted with oxygen ions is greater than a thickness of a portion of the gate insulation layer which is not implanted with oxygen ions;

forming a gate conductive layer on the gate insulation layer; and anisotropically etching the gate conductive layer and the gate insulation layer.

11. The method according to claim 10, wherein anisotropically etching the gate conductive layer and the gate insulation layer is conducted by over-etching such that a partial thickness of the drain region is also etched.

12. The method according to claim 1, further comprising:

forming a second conductivity type fifth ion implantation layer under the first conductivity type fourth ion implantation layer.

13. The method according to claim 12, wherein the second conductivity type fifth ion implantation layer is formed by ion-implanting p-type impurities at a concentration of approximately $1\times10^{11}$-$1\times10^{13}$ ions/cm$^2$ and an energy level of approximately 300-1,000 KeV.

* * * * *